US009214482B2

(12) United States Patent
Shi

(10) Patent No.: US 9,214,482 B2
(45) Date of Patent: Dec. 15, 2015

(54) ARRAY SUBSTRATE AND DISPLAY DEVICE

(71) Applicant: BOE Technology Group Co., Ltd., Beijing (CN)

(72) Inventor: Lei Shi, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 15 days.

(21) Appl. No.: 14/089,841

(22) Filed: Nov. 26, 2013

(65) Prior Publication Data

US 2014/0145199 A1 May 29, 2014

(30) Foreign Application Priority Data

Nov. 26, 2012 (CN) .......................... 2012 1 0489122

(51) Int. Cl.
  *H01L 29/04* (2006.01)
  *H01L 27/12* (2006.01)
  *H01L 29/49* (2006.01)
  *H01L 29/66* (2006.01)
  *H01L 29/786* (2006.01)

(52) U.S. Cl.
  CPC ........ *H01L 27/1251* (2013.01); *H01L 29/4908* (2013.01); *H01L 29/6675* (2013.01); *H01L 29/78648* (2013.01)

(58) Field of Classification Search
  CPC ................ H01L 29/42384; H01L 29/4908; H01L 29/786; H01L 21/28008; H01L 29/6674; H01L 27/124; H01L 29/7869; H01L 29/78645; H01L 29/78648; H01L 29/78672
  USPC .............................. 257/57–59, 70–72, 57–59
  See application file for complete search history.

(56) References Cited

U.S. PATENT DOCUMENTS

| 5,834,797 | A | 11/1998 | Yamanaka |
| 6,015,724 | A | 1/2000 | Yamazaki |
| 6,534,788 | B1 * | 3/2003 | Yeo et al. ................ 257/72 |
| 2001/0030323 | A1 | 10/2001 | Ikeda |
| 2002/0034842 | A1 | 3/2002 | Joo et al. |
| 2002/0139979 | A1 | 10/2002 | Joo et al. |
| 2007/0026555 | A1 | 2/2007 | Lee |
| 2011/0024755 | A1 | 2/2011 | Korenari et al. |
| 2012/0289007 | A1 | 11/2012 | Liu et al. |

FOREIGN PATENT DOCUMENTS

| CN | 102709184 A | 10/2012 |
| KR | 2001-0093719 A | 10/2001 |
| KR | 10-2007-0081218 A | 8/2007 |

OTHER PUBLICATIONS

First office action issued by Chinese Patent Office for priority application 201210489122.2 dated Aug. 29, 2014 with English translation.
Notice of Preliminary Rejection issued by Korean Intellectual Property Office for corresponding application 10-2013-0144114 dated Dec. 1, 2014 with English translation.
European search report issued by European Patent Office for corresponding application 13193660 dated Feb. 10, 2014.
Second office action issued by Chinese Patent Office for priority application 201210489122.2 dated Dec. 16, 2014 with English translation.

* cited by examiner

*Primary Examiner* — Dung Le
(74) *Attorney, Agent, or Firm* — Frommer Lawrence & Haug LLP

(57) ABSTRACT

An array substrate and a display device includes: a base substrate; a TFT, a gate line, a data line and a pixel electrode formed on the base substrate, the TFT includes: a bottom gate, a first gate insulating layer, an active layer, a second gate insulating layer, a top gate, a gate isolation layer and a source electrode and a drain electrode sequentially formed on the base substrate; wherein, the source electrode and the drain electrode are in contact with the active layer through a first via hole and a second via hole passing through the gate isolation layer and the second insulating layer, respectively; the pixel electrode is in contact with the drain electrode.

14 Claims, 7 Drawing Sheets

ARRAY SUBSTRATE AND DISPLAY DEVICE

FIELD OF THE INVENTION

The present invention relates to the field of display technology, and particularly, to an array substrate and a method fabricating an array substrate, and a display device.

BACKGROUND OF THE INVENTION

With the development of information and network, electronic display techniques have been widely used. Currently, liquid crystal display (LCD) display devices and active matrix/organic light emitting diode (AMOLED) display devices are popular. LCD and AMOLED display devices are generally driven using active matrix driving techniques, such as techniques for driving thin film transistor (TFT) array substrate.

Existing array substrates usually employ one-sided gate structure, an array substrate with one-sided gate structure has only a conductive channel existing at a side close to the gate when being turned on, and electrons are very likely to be scattered during their moving, which results in low mobility and limits performance of the array substrate.

SUMMARY OF THE INVENTION (1) Technical Problems to be Solved

Technical problems to be solved by the present invention are: providing an array substrate, a method for fabricating the array substrate, and a display device to improve performance of the array substrate, and improve driving ability and sub-threshold characteristics of the array substrate as well, directed to deficiencies in the prior art.

(2) Technical Solutions

To solve the above problems, the present invention provides an array substrate, which includes: a base substrate; a TFT, a gate line, a data line and a pixel electrode formed on the base substrate, the TFT includes: a bottom gate, a first gate insulating layer, an active layer, a second gate insulating layer, a top gate, a gate isolation layer and a source electrode and a drain electrode sequentially formed on the base substrate; wherein, the source electrode and the drain electrode are in contact with the active layer through a first via hole and a second via hole passing through the gate isolation layer and the second insulating layer, respectively; the pixel electrode is in contact with the drain electrode.

Wherein, the array substrate further includes: a flattening layer located between the TFT and the pixel electrode, the flattening layer does not cover a third via hole through which the drain electrode is in contact with the pixel electrode.

Wherein, the array substrate further includes a nickel layer, the nickel layer is disposed between the source electrode and the active layer and/or between the drain electrode and the active layer.

Wherein, a thickness of the top gate is in the range of 150 nm-300 nm.

Preferably, the thickness of the top gate is 200 nm.

Wherein, a thickness of the nickel layer is in the range of 20 nm-25 nm.

Wherein, a thickness of the active layer is in the range of 20 nm-100 nm,

Wherein, material of the gate isolation layer includes $SiO_2$ and/or $SiN_x$.

The present invention further provides a display device, characterized in that it includes the above array substrate.

The present invention further provides a method for fabricating an array substrate, which includes steps:

S1: sequentially forming a bottom gate, a first gate insulating layer, an active layer and a second gate insulating layer on a base substrate, wherein a gate line is formed at the same time as forming the bottom gate;

S2: forming a top gate on the second gate insulating layer;

S3: sequentially forming a gate isolation layer, a source electrode, a drain electrode and a pixel electrode on the top gate.

Wherein, before step S2, the method further includes step S2' including: forming a nickel layer at an area on the active layer where the source electrode is to be formed and/or an area on the active layer where the drain electrode is to be formed, and then performing a heat treatment on the active layer at a temperature in the range of 500° C.-570° C. for 2 hours in en atmosphere of $H_2$.

Wherein, before step S3, the method further includes step S3' including: doping the active layer subjected to the heat treatment in step S2'.

Wherein, step S3 includes: forming an insulating film on the substrate formed in step S3', forming a first via hole and a second via hole at an area where the source electrode is to be formed and an area where the drain electrode is to be formed, respectively, through a patterning process, and exposing the active layer by the first via hole and the second via hole;

forming a source-drain metal film, forming patterns of the source electrode and the drain electrode through a patterning process, and forming a data line at the same time as forming the patterns of the source electrode and the drain electrode;

forming a flattening layer film, forming a third via hole at an area corresponding to the drain electrode in the flattening layer film through a patterning process, so as to form a pattern of the flattening layer; and forming a transparent conductive film, and forming a pattern of the pixel electrode through a patterning process, the pixel electrode being in contact with the drain electrode;

wherein, the flattening layer formed between the TFT and the pixel electrode does not cover the third via hole through which the drain electrode is in contact with the pixel electrode.

(3) Beneficial Effects

The array substrate provided by the present invention employs a two-sided gate structure, that is, gates are formed at both sides of the active layer, an array substrate with the two-sided gate structure has conductive channels existing at both sides of the active layer when being turned on, carriers are not likely to be scattered during their moving, forming inversion layers at both upper and lower surfaces at the same time can be achieved in a situation where a proper silicon film (active layer) is selected, carrier concentrations in the inversion layers at both upper and lower surfaces increase rapidly with increase of gate voltage in a situation where the silicon film is fully depleted, and driving ability, and sub-threshold and frequency response characteristics of the array substrate are closer to an ideal state.

Wherein, 11: substrate; 12: bottom gate; 13: first gate insulating layer; 14: active layer; 15: nickel layer; 16: second gate insulating layer; 17: top gate; 18: gate isolation layer; 19: source electrode; 110: drain electrode; 111: flattening layer; 112: pixel electrode; 191: first via hole; 1101: second via hole; 1111: third via hole.

DETAILED DESCRIPTION OF EMBODIMENTS

Specific implementations of the present invention will be further described below in details with reference to the drawings and the embodiments. The below embodiments are used to explain the present invention, but not used to limit the scope the present invention.

Embodiment 1

Figure 1:
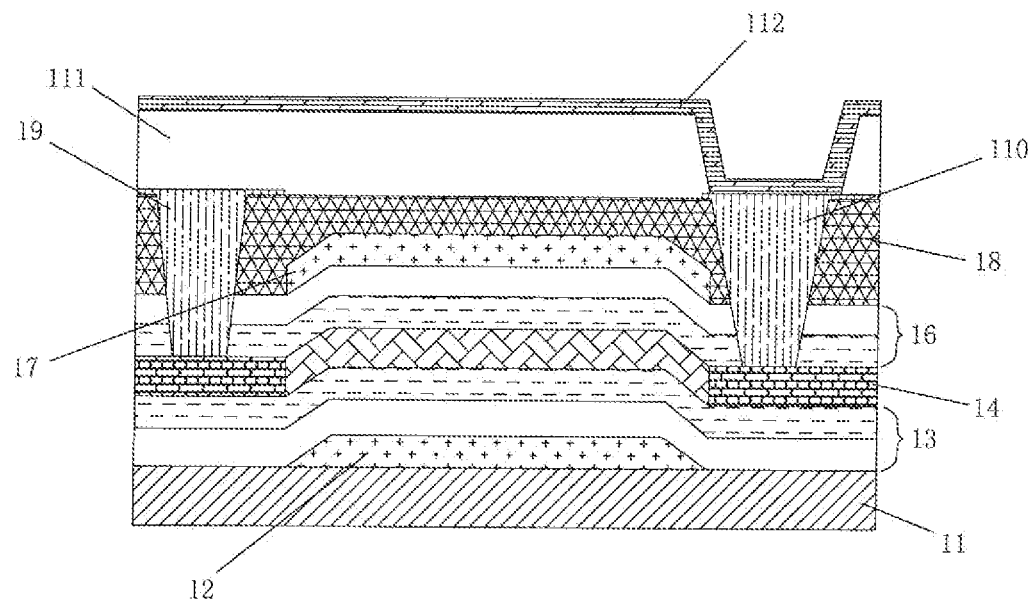
FIG. 1 is a structural schematic diagram of an array substrate of Embodiment 1 of the present invention.

As illustrated in FIG. 1, the present invention provides an array substrate, which includes: a base substrate 11, a TFT, a gate line, a data line and a pixel electrode 112 formed on the base substrate 11, the TFT includes: a bottom gate 12, a first gate insulating layer 13, an active layer 14, a second gate insulating layer 16, a top gate 17, a gate isolation layer 18 and a source electrode 19 and a drain electrode 110 sequentially formed on the base substrate 11, wherein material of the gate isolation layer 18 includes $SiO_2$ and/or $SiN_x$.

In this embodiment, forming inversion layers at both upper and lower surfaces of a silicon film at the same time can be achieved in a situation where a proper silicon film is selected, carrier concentrations in the inversion layers of both upper and lower surfaces increase rapidly with the increase of gate voltage in a situation where the silicon film is fully depleted, and the driving ability and sub-threshold and frequency response characteristics of the array substrate are closer to an ideal state.

Figure 10:
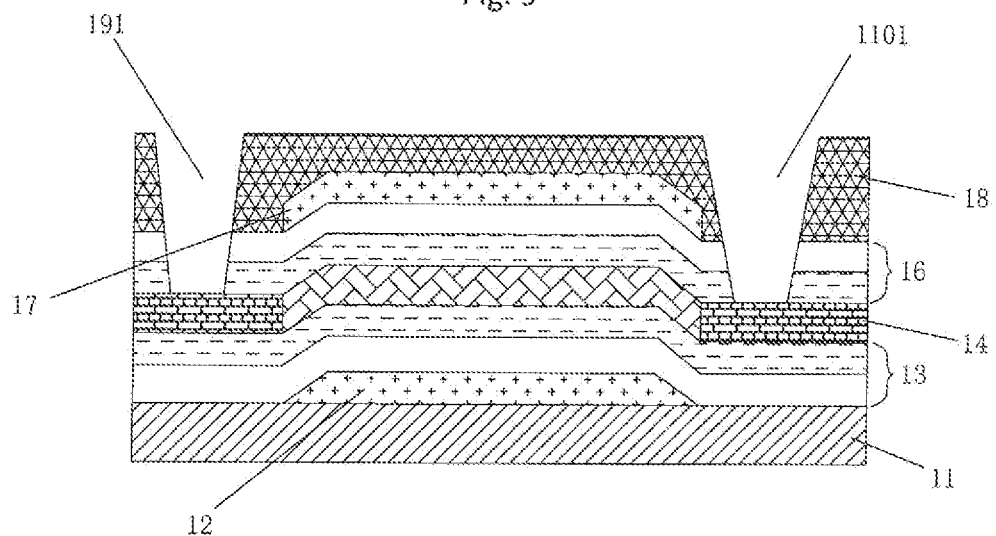
Figure 11:
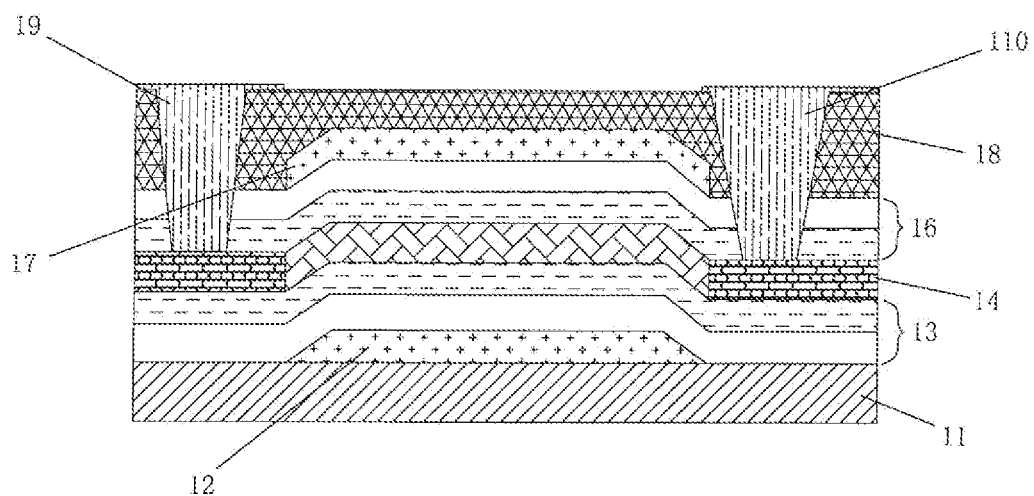

Wherein, the source electrode 19 and the drain electrode 110 are in contact with the active layer 14 through a first via hole 191 and a second via hole 1101 passing through the gate isolation layer 18 and the second insulating layer 16 (referring to FIG. 10), respectively; the pixel electrode 112 is in contact with the drain electrode 110.

Figure 12:
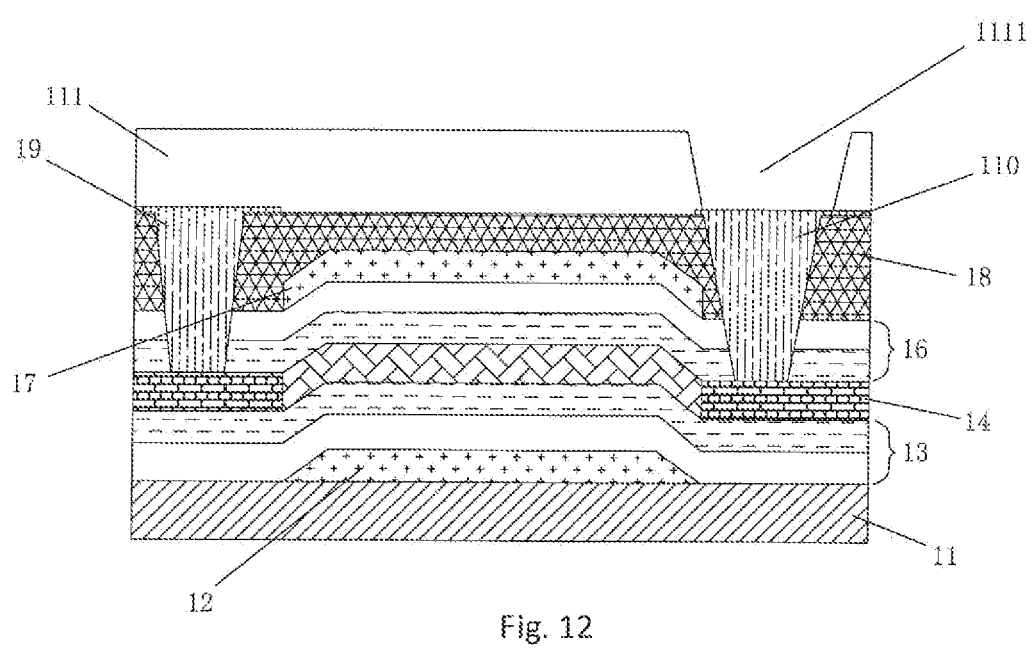

The array substrate further includes: a flattening layer 111 located between the TFT and the pixel electrode 112, the flattening layer 111 does not cover a third via hole 1111 (referring to FIG. 12) through which the drain electrode 110 is in contact with the pixel electrode 112.

A thickness of the top gate 17 is in the range of 150 nm-300 nm, and preferably is 200 nm; the active layer 14 is an α-Si film, and has a thickness in the range of 20 nm-100 nm.

The first insulating layer 13 includes: $SiO_2$ and $SiN_x$, wherein a part close to the bottom gate 12 uses $SiN_x$, and a part close to the active layer 14 uses $SiO_2$.

The second insulating layer 16 includes: $SiO_2$ and $SiN_x$, wherein a part close to the top gate 17 uses $SiN_x$, and a part close to the active layer 14 uses $SiO_2$.

Embodiment 2

Figure 2:
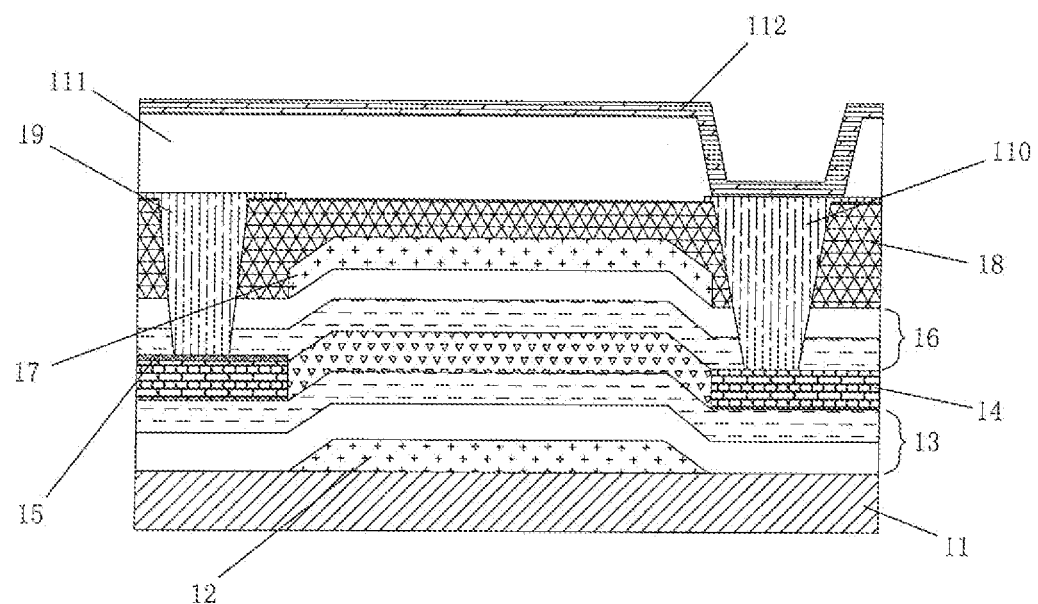
FIG. 2 is a structural schematic diagram of an array substrate of Embodiment 2 of the present invention.

As illustrated in FIG. 2, the array substrate of this embodiment has a structure substantially the same as that of the array substrate of Embodiment 1, and also includes: a base substrate 11, a TFT, a gate line, a data line and a pixel electrode 112 formed on the base substrate 11, the TFT includes: a bottom gate 12, a first gate insulating layer 13, an active layer 14, a second gate insulating layer 16, a top gate 17, a gate isolation layer 18 and a source electrode 19 and a drain electrode 110 sequentially formed on the base substrate 11, wherein the gate isolation layer 18 includes $SiN_x$.

Wherein, the source electrode 19 and the drain electrode 110 are in contact with the active layer 14 through a first via hole 191 and a second via hole 1101 passing through the gate isolation layer 18 and the second insulating layer 16, respectively; the pixel electrode 112 is in contact with the drain electrode 110.

The array substrate further includes: a flattening layer 111 located between the TFT and the pixel electrode 112, the flattening layer 111 does not cover a third via hole 1111 (referring to FIG. 12) through which the drain electrode 110 is in contact with the pixel electrode 112.

A thickness of the top gate 17 is in the range of 150 nm-300 nm, and preferably is 200 nm; the active layer 14 is an α-Si film, and has a thickness in the range of 20 nm-100 nm.

The first insulating layer 13 includes: $SiO_2$ and $SiN_x$, wherein a part close to the bottom gate 12 uses $SiN_x$, and a part close to the active layer 14 uses $SiO_2$.

The second insulating layer 16 includes: $SiO_2$ and $SiN_x$, wherein a part close to the top gate 17 uses $SiN_x$, and a part close to the active layer 14 uses $SiO_2$.

The difference between the array substrates of the above two embodiment exists in that the TFT further includes a nickel layer 15, the nickel layer 15 is disposed between the source electrode 19 and the active layer 14, and a thickness of the nickel layer 15 is in the range of 20 nm-25 nm.

The nickel layer 15 can induce lateral crystallization of the active layer (the α-Si film), which effectively reduces phase change energy of a crystallization process, the converted active layer is in a polycrystalline state, and high mobility of polysilicon helps to improve performance of a TFT device.

Embodiment 3

The array substrate of this embodiment has a structure substantially the same as those of the array substrates of Embodiment 1 and Embodiment 2, and also includes: a base substrate 11, a TFT, a gate line, a data line and a pixel electrode 112 formed on the base substrate 11, the TFT includes: a bottom gate 12, a first gate insulating layer 13, an active layer 14, a second gate insulating layer 16, a top gate 17, a gate isolation layer 18 and a source electrode 19 and a drain electrode 110 sequentially formed on the base substrate 11, wherein the gate isolation layer 16 includes $SiO_2$.

Wherein, the source electrode 19 and the drain electrode 110 are in contact with the active layer 14 through a first via hole 191 and a second via hole 1101 passing through the gate isolation layer 18 and the second insulating layer 16, respectively; the pixel electrode 112 is in contact with the drain electrode 110.

The array substrate further includes: a flattening layer 111 located between the TFT and the pixel electrode 112, the flattening layer 111 does not cover a third via hole 1111 (referring to FIG. 12) through which the drain electrode 110 is in contact with the pixel electrode 112.

A thickness of the top gate 17 is in the range of 150 nm-300 nm, and preferably is 200 nm; the active layer 14 is an α-Si film, and has a thickness in the range of 20 nm-100 nm.

The first insulating layer 13 includes: SiO₂ and SiN$_x$, wherein a part close to the bottom gate 12 uses SiN$_x$, and a part close to the active layer 14 uses SiO₂.

The second insulating layer 16 includes: SiO₂ and SiN$_x$, wherein a part close to the top gate 17 uses SiN$_x$ and a part close to the active layer 14 uses SiO₂.

Embodiment 3 differs from the Embodiment 2 in that a nickel layer 15 included in the array substrate is disposed between the drain electrode 110 and the active layer 14, or disposed between the source electrode 19 and the active layer 14 and between the drain electrode 110 and the active layer 14; a thickness of the nickel layer 15 is in the range, of 20 nm-25 nm.

Embodiment 4

Figure 3:
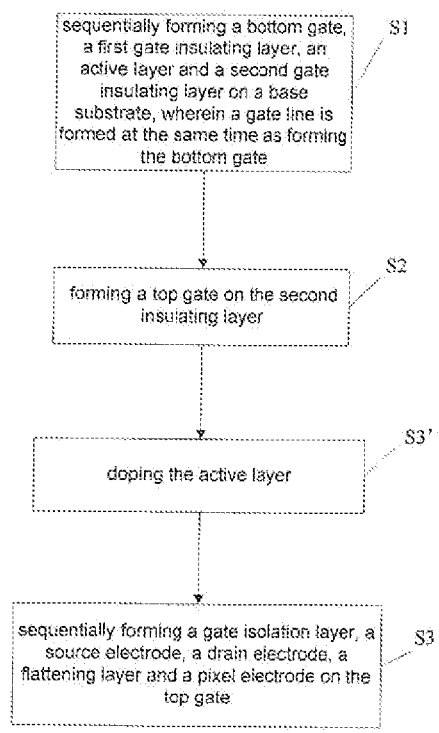
FIG. 3 is a flow chart of a method for fabricating an array substrate of Embodiment 4 of the present invention.
Figure 4:
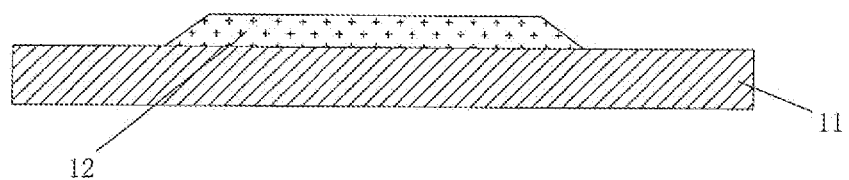
FIGS. 4 to 12 are structural schematic diagrams illustrating the method for fabricating an array substrate of Embodiment 4 of the present invention.
Figure 5:
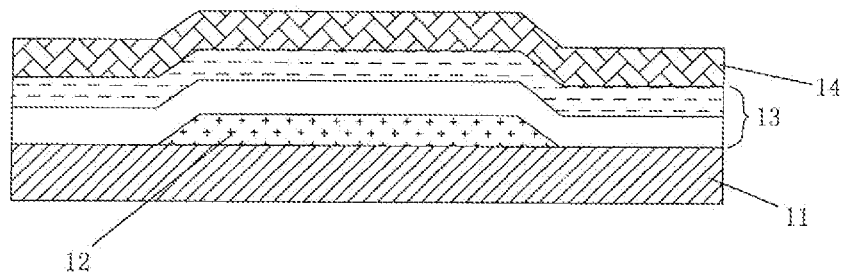
Figure 6:
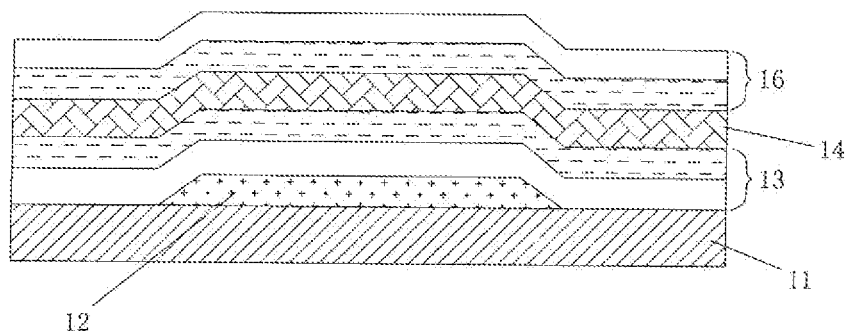
Figure 7:
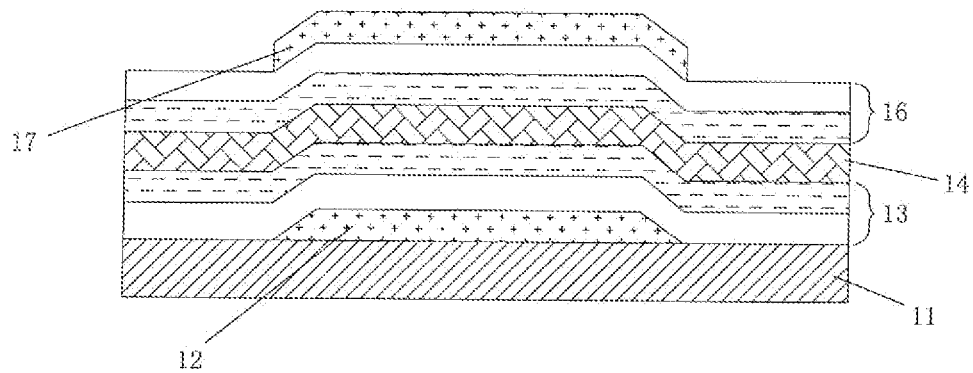
Figure 8:
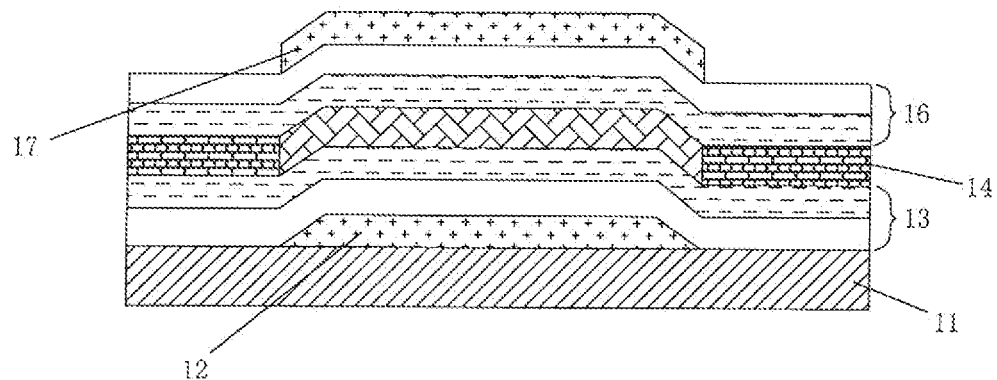
Figure 9:
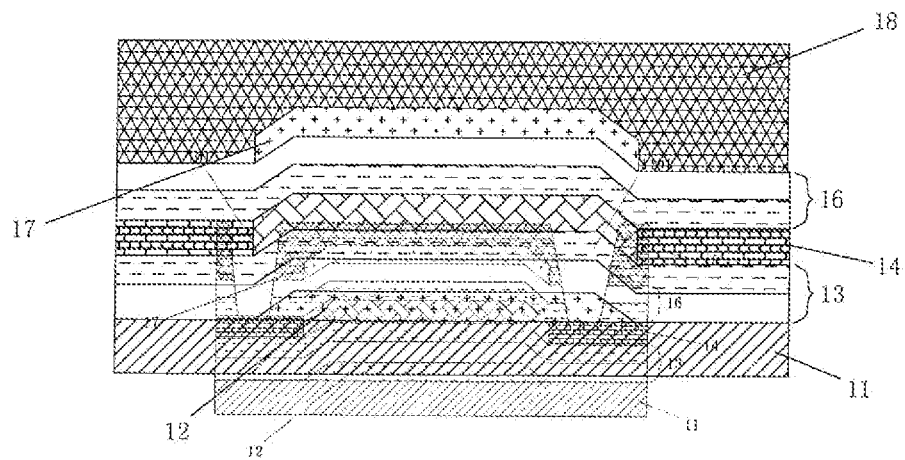

As illustrated in FIG. 3 and referring to FIGS. 4 to 12, the present invention also provides a method for fabricating an array substrate, which includes steps:

S1: as illustrated in FIGS. 4 to 6, sequentially forming a bottom gate 12, a first gate insulating layer 13, an active layer 14 and a second gate insulating layer 16 on a base substrate 11, wherein a gate line is formed at the same time as forming the bottom gate 12;

S2: as illustrated in FIG. 7, forming a top gate 17 on the second gate insulating layer 16;

S3': as illustrated in FIG. 8, doping the active layer 14;

S3: as illustrated in FIGS. 9-12 and FIG. 1, sequentially forming a gate isolation layer 18, a source electrode 19, a drain electrode 110, a flattening layer 111 and a pixel electrode 112 illustrated in FIG. 1 on the top gate 17.

S3 specifically includes: forming an insulating film on the substrate formed by step of S3', forming a first via hole 191 and a second via hole 1101 at an area where the source electrode 19 is to be formed and an area where the drain electrode 110 is to be formed, respectively, through a patterning process, and exposing the active layer 14 by the first via hole 191 and the second via hole 1101;

forming a source-drain metal film, forming patterns of the source electrode 19 and the drain electrode 110 through a patterning process, and forming a data line at the same time as forming the patterns of the source electrode 19 and the drain electrode 110;

forming a flattening layer film, forming a third via hole 1111 at an area corresponding to the drain electrode 110 in the flattening layer film through a patterning process, so as to form a pattern of the flattening layer 111 (referring to FIG. 12); and forming a transparent conductive film, forming a pattern of the pixel electrode 112 through a patterning process, and the pixel electrode 112 is in contact with the drain electrode 110.

Wherein, the flattening layer 111 formed between the TFT and the pixel electrode 112 does not cover the third via hole 1111 through which the drain electrode 110 is in contact with the pixel electrode 112.

Embodiment 5

As illustrated in FIGS. 4 to 12, the method for fabricating an array substrate of this embodiment is substantially the same as that of Embodiment 4, which includes:

S1: sequentially forming a bottom gate 12, a first gate insulating layer 13, an active layer 14 and a second gate insulating layer 16 on a base substrate 11, wherein a gate line is formed at the same time as forming the bottom gate 12;

S2: forming a top gate 17 on the second gate insulating layer 16;

S3': doping the active layer 14;

S3: sequentially forming a gate isolation layer 18, a source electrode 19, a drain electrode 110, a flattening layer 111 and a pixel electrode 112 illustrated in FIG. 1 on the top gate 17.

S3 specifically includes: forming an insulating film on the substrate formed by step of S3', forming a first via hole 191 and a second via hole 1101 at an area where the source electrode 19 is to be formed and an area where the drain electrode 110 is to be formed, respectively, through a patterning process, and exposing the active layer 14 by the first via hole 191 and the second via hole 1101;

forming a source-drain metal film, forming patterns of the source electrode 19 and the drain electrode 110 through a patterning process, and forming a data line at the same time as forming the patterns of the source electrode 19 and the drain electrode 110;

forming a flattening layer film, forming a third via hole 1111 at an area corresponding to the drain electrode 110 in the flattening layer film through a patterning process, so as to form a pattern of the flattening layer 111 (referring to FIG. 12); and forming a transparent conductive film, forming a pattern of the pixel electrode 112 through a patterning process, and the pixel electrode 112 is in contact with the drain electrode 110.

Wherein, the flattening layer 111 formed between the TFT and the pixel electrode 112 does not cover the third via hole 1111 through which the drain electrode 110 is in contact with the pixel electrode 112.

Figure 13:
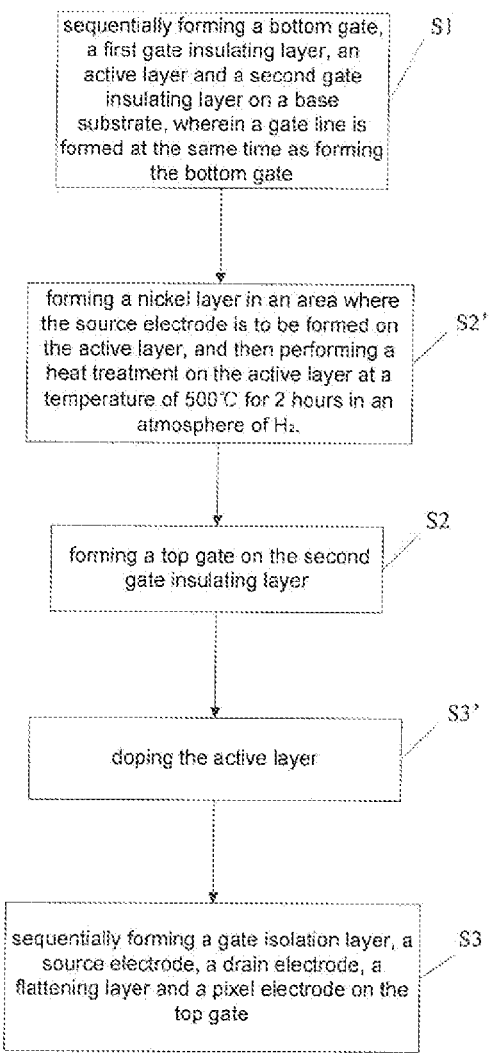
FIG. 13 is a flow chart of a method for fabricating an array substrate of Embodiment 5 of the present invention.
Figure 14:
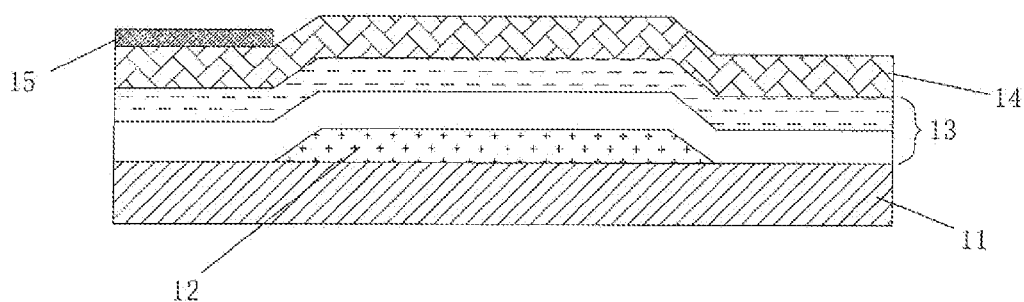
FIGS. 14 and 15 are structural schematic diagrams illustrating the method for fabricating an array substrate of Embodiment 5 of the present invention.
Figure 15:
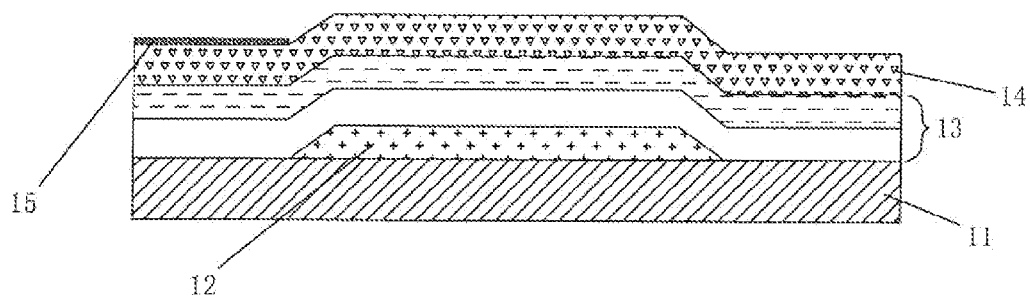

Embodiment 5 differs from Embodiment 4 in that, as illustrated in FIG. 13 and referring to FIGS. 14 and 15, this embodiment further includes S2' before S2, and S2' includes: forming a nickel layer 15 at an area on the active layer 14 where the source electrode 19 is to be formed, and then performing a heat treatment on the active layer 14 at a temperature of 500° C. for 2 hours in an atmosphere of H₂.

Adding metal Ni onto the active layer (the α-Si film) can effectively reduce energy of phase change converting from α-Si to P—Si, the converted active layer is in a polycrystalline state, and lateral crystallization can be achieved, and such a process is a metal-induced lateral crystallization process (MILC process).

In this embodiment, a MILC process is employed, a nickel layer is deposited on the surface of an amorphous silicon film using a sputtering process, the amorphous silicon can be converted into polysilicon at a suitable temperature, and induced lateral crystallization is further achieved. This method effectively reduces energy of phase change in a crystallization process, and high mobility of polysilicon helps to improve performance of a device. The structure with two gates can make the carriers in sub-threshold state away from a Si—SiO₂ interface, which effectively reduces scattering of carriers in channel which results from the fact that they collide with too many defects when drifting under the source-drain electric field, and thus significantly improving mobility.

Embodiment 6

The method for fabricating an array substrate of this embodiment is substantially the same as that of Embodiment 5, which also includes:

S1: sequentially forming a bottom gate 12, a first gate insulating layer 13, an active layer 14 and a second gate insulating layer 16 on a base substrate 11, wherein a gate line is formed at the same time as forming the bottom gate 12;

S2: forming a top gate 17 on the second gate insulating layer 16;

S3': doping the active layer 14;

S3: sequentially forming a gate isolation layer 18, a source electrode 19, a drain electrode 110, a flattening layer 111 and a pixel electrode 112 illustrated in FIG. 1 on the top gate 17.

S3 specifically includes: forming an insulating film on the substrate formed in step S3', forming a first via hole 191 and a second via hole 1101 at an area where the source electrode 19 is to be formed and an area where the drain electrode 110 is to be formed, respectively, through a patterning process, and exposing the active layer 14 by the first via hole 191 and the second via hole 1101;

forming a source-drain metal film, forming patterns of the source electrode 19 and the drain electrode 110 through a patterning process, and forming a data line at the same time as forming the patterns of the source electrode 19 and the drain electrode 110;

forming a flattening layer film, forming a third via hole 1111 at an area corresponding to the drain electrode 110 in the flattening layer film through a patterning process, so as to form a pattern of the flattening layer 111 (referring to FIG. 12); and forming a transparent conductive film, forming a pattern of the pixel electrode 112 through a patterning process, and the pixel electrode 112 is in contact with the drain electrode 110.

Wherein, the flattening layer 111 formed between the TFT and the pixel electrode 112 does not cover the third via hole 1111 through which the drain electrode 110 is in contact with the pixel electrode 112.

Embodiment 6 differs from Embodiment 5 in that this embodiment further includes S2' before S2. and S2' includes: forming a nickel layer 15 at an area on the active layer 14 where the drain electrode 110 is to be formed, and then performing a heat treatment on the active layer 14 at a temperature of 540° C. for 2 hours in an atmosphere of $H_2$.

Embodiment 7

The method for fabricating an array substrate of this embodiment is substantially the same as that of Embodiment 6 which also includes:

S1: sequentially forming a bottom gate 12, a first gate insulating layer 13, an active layer 14 and a second gate insulating layer 16 on a base substrate 11, wherein a gate line is formed at the same time as forming the bottom gate 12;

S2: forming a top gate 17 on the second gate insulating layer 16;

S3': doping the active layer 14;

S3: sequentially forming a gate isolation layer 18, a source electrode 19, a drain electrode 110, a flattening layer 111 and a pixel electrode 112 illustrated in FIG. 1 on the top gate 17.

S3 specifically includes: forming an insulating film on the substrate formed in step S3', forming a first via hole 191 and a second via hole 1101 at an area where the source electrode 19 is to be formed and an area where the drain electrode 110 is to be formed, respectively, through a patterning process, and exposing the active layer 14 by the first via hole 191 and the second via hole 1101;

forming a source-drain metal film, forming patterns of the source electrode 19 and the drain electrode 110 through a patterning process, and forming a data line at the same time as forming the patterns of the source electrode 19 and the drain electrode 110;

forming a flattening layer film, forming a third via hole 1111 at an area corresponding to the drain electrode 110 in the flattening layer film through a patterning process, so as to form a pattern of the flattening layer 111 (referring to FIG. 12); and forming a transparent conductive film, forming a pattern of the pixel electrode 112 through a patterning process, and the pixel electrode 112 is in contact with the drain electrode 110.

Wherein, the flattening layer 111 formed between the TFT and the pixel electrode 112 does not cover the third via hole 1111 through which the drain electrode 110 is in contact with the pixel electrode 112.

Embodiment 7 differs from Embodiments 6 and 5 in that this embodiment further includes S2' before S2. and S2' includes: forming a nickel layer 15 at an area on the active layer 14 where the source electrode 19 is to be formed and an area on the active layer 14 where the drain electrode 110 is to be formed, and then performing a heat treatment on the active layer 14 at a temperature of 570° C. for 2 hours in an atmosphere of $H_2$.

Embodiment 8

This embodiment provides a display device, which includes the array substrate described in any of the above embodiments.

The above implementations are only used to explain the present invention, but not to limit the present invention, the person skilled in the art can make various variations and modifications without departing from the spirit and scope of the present invention, therefore, all equivalent technical solutions fall within the scope of the present invention, and the protection scope of the present invention should be defined by the claims.

The invention claimed is:

1. An array substrate, comprising:
    a base substrate; and
    a TFT, a gate line, a data line and a pixel electrode formed on the base substrate, wherein
    the TFT includes: a bottom gate, a first gate insulating layer, an active layer, a second gate insulating layer, a top gate, a gate isolation layer and a source electrode and a drain electrode sequentially formed on the base substrate;
    wherein, the source electrode and the drain electrode are in contact with the active layer through a first via hole and a second via hole passing through the gate isolation layer and the second insulating layer, respectively; the pixel electrode is in contact with the drain electrode, and
    wherein the array substrate further includes a nickel layer, and the nickel layer is disposed between the source electrode and the active layer and/or between the drain electrode and the active layer.

2. The array substrate of claim 1, wherein the array substrate further includes a flattening layer located between the TFT and the pixel electrode, and the flattening layer does not cover a third via hole through which the drain electrode is in contact with the pixel electrode.

3. The array substrate of claim 1, wherein a thickness of the top gate is in the range of 150 nm-300 nm.

4. The array substrate of claim 3, wherein the thickness of the top gate is 200 nm.

5. The array substrate of claim 1, wherein a thickness of the nickel layer is in the range of 20 nm-25 nm.

6. The array substrate of claim 1, wherein a thickness of the active layer is in the range of 20 nm-100 nm.

7. The array substrate of claim 1, wherein material of the gate isolation layer includes $SiO_2$ and/or $SiN_x$.

8. A display device, including the array substrate according to claim 1,
    wherein the array substrate further includes a nickel layer, and the nickel layer is disposed between the source electrode and the active layer and/or between the drain electrode and the active layer.

9. The display device of claim 8, wherein the array substrate further includes a flattening layer located between the TFT and the pixel electrode, and the flattening layer does not cover a third via hole through which the drain electrode is in contact with the pixel electrode.

10. The display device of claim 8, wherein a thickness of the top gate is in the range of 150 nm-300 nm.

11. The display device of claim 10, wherein the thickness of the top gate is 200 nm.

12. The display device of claim 8, wherein a thickness of the nickel layer is in the range of 20 nm-25 nm.

13. The display device of claim 8, wherein a thickness of the active layer is in the range of 20 nm-100 nm.

14. The display device of claim 8, wherein material of the gate isolation layer includes $SiO_2$ and/or $SiN_x$.

* * * * *